(12) United States Patent
Wu et al.

(10) Patent No.: US 11,100,272 B2
(45) Date of Patent: Aug. 24, 2021

(54) WAFER-TO-DESIGN IMAGE ANALYSIS (WDIA) SYSTEM

(71) Applicant: TAIWAN SEMICONDUCTOR MANUFACTURING CO., LTD., Hsinchu (TW)

(72) Inventors: Cheng-Chi Wu, Hsinchu (TW); Wen-Chuan Wang, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 16/542,087

(22) Filed: Aug. 15, 2019

(65) Prior Publication Data
US 2020/0143099 A1 May 7, 2020

Related U.S. Application Data

(60) Provisional application No. 62/719,357, filed on Aug. 17, 2018.

(51) Int. Cl.
*G06F 30/30* (2020.01)
*G03F 7/20* (2006.01)
*G01N 23/2251* (2018.01)
*G06F 30/398* (2020.01)
*G06F 30/392* (2020.01)

(52) U.S. Cl.
CPC ........ *G06F 30/398* (2020.01); *G03F 7/70633* (2013.01); *G01N 23/2251* (2013.01); *G06F 30/392* (2020.01)

(58) Field of Classification Search
None
See application file for complete search history.

(56) References Cited

U.S. PATENT DOCUMENTS

| 5,701,013 | A | 12/1997 | Hsia et al. |
| 5,926,690 | A | 7/1999 | Toprac et al. |
| 6,094,256 | A | 7/2000 | Grodnensky et al. |
| 6,918,104 | B2* | 7/2005 | Pierrat ............... G03F 1/36 428/195.1 |
| 7,003,757 | B2* | 2/2006 | Pierrat ............... G03F 1/36 430/30 |

(Continued)

OTHER PUBLICATIONS

H. Morokuma et al., "A new matching engine between design layout and SEM image of semiconductor device," 2005 Proc. SPIE vol. 5752, pp. 546-558. (Year: 2005).*

(Continued)

*Primary Examiner* — Leigh M Garbowski
(74) *Attorney, Agent, or Firm* — McDermott Will & Emery LLP

(57) ABSTRACT

A method includes obtaining a layout of a circuit pattern implemented on a semiconductor wafer, and identifying one or more polygons in the layout based on a length criteria. One or more measurement gauges are placed on the identified polygons to thereby obtain measured polygons. A scanning electron microscope (SEM) image of the circuit pattern is obtained. The SEM image is aligned with the layout including the measured polygons. A critical dimension of one or more objects in the SEM image is measured. The one or more objects correspond to the one or more polygons. Based on the measured critical dimension, it is determined whether the circuit pattern is acceptable.

19 Claims, 14 Drawing Sheets

(56) References Cited

U.S. PATENT DOCUMENTS

| | | | |
|---|---|---|---|
| 7,365,322 B2 | 4/2008 | Miyamoto et al. | |
| 7,408,154 B2* | 8/2008 | Oosaki | H01J 37/222 250/306 |
| 7,631,286 B2 | 12/2009 | Piper et al. | |
| 8,020,120 B2* | 9/2011 | Heng | G06F 30/398 716/52 |
| 8,073,242 B2 | 12/2011 | Miyamoto et al. | |
| 8,090,186 B2* | 1/2012 | Nagano | G06T 7/001 382/141 |
| 8,108,805 B2* | 1/2012 | Rathsack | G03F 7/705 716/52 |
| 8,196,068 B2 | 6/2012 | Zhang | |
| 8,364,452 B2* | 1/2013 | Mitsuhashi | G03F 1/36 703/6 |
| 8,445,871 B2* | 5/2013 | Matsuoka | G03F 7/70616 250/492.22 |
| 9,189,843 B2* | 11/2015 | Kitamura | G06K 9/00 |
| 9,282,293 B2* | 3/2016 | Fang | G06T 7/0004 |
| 9,401,014 B2* | 7/2016 | Zafar | G06T 7/0006 |
| 9,696,150 B2* | 7/2017 | Matsuoka | G01B 15/00 |
| 9,851,714 B2* | 12/2017 | Dalla-Torre | G05B 19/41875 |
| 9,858,659 B2* | 1/2018 | Minakawa | G06T 7/001 |
| 9,892,500 B2* | 2/2018 | Lee | G06T 7/0004 |
| 10,545,490 B2* | 1/2020 | Dalla-Torre | G06T 7/0004 |
| 10,663,870 B2* | 5/2020 | Chen | G03F 7/70625 |
| 2006/0091309 A1 | 5/2006 | Oosaki et al. | |
| 2006/0284081 A1 | 12/2006 | Miyamoto et al. | |
| 2011/0147587 A1 | 6/2011 | Yang et al. | |
| 2014/0206112 A1 | 7/2014 | Montgomery et al. | |
| 2016/0314572 A1* | 10/2016 | Fang | G01N 23/2251 |
| 2017/0046588 A1* | 2/2017 | Cho | G06K 9/6204 |
| 2017/0084016 A1* | 3/2017 | Chen | G06K 9/6204 |
| 2020/0089122 A1* | 3/2020 | Wang | G03F 7/70433 |
| 2020/0097621 A1* | 3/2020 | Hu | G06F 30/3323 |
| 2020/0159124 A1* | 5/2020 | Wang | G03F 7/70433 |

OTHER PUBLICATIONS

P. Cantu et al., "Evaluation of Hitachi CAD to CD-SEM metrology package for OPC model tuning and product devices OPC verification," 2005 Proc. of SPIE vol. 5752, pp. 1341-1352. (Year: 2005).*

T. Kitamura et al., "Introduction of a Die-to-Database Verification Tool for the Entire Printed Geometry of a Die—Geometry Verification System NGR2100 for DFM," 2005 Proc. of SPIE vol. 5853, pp. 988-999. (Year: 2005).*

C. Tabery et al., "Use of design pattern layout for automatic metrology recipe generation," 2005 Proc. of SPIE vol. 5752, pp. 1424-1434. (Year: 2005).*

B. Bunday et al., Automated CD-SEM recipe creation: a new paradigm in CD-SEM utilization, 2006 Proc. of SPIE vol. 6152, 17 pages. (Year: 2006).*

L. Capodieci et al., "Design-driven metrology: a new paradigm for DFM-enabled process characterization and control, extensibility, and limitations," 2006 Proc. of SPIE vol. 6152, 13 pages. (Year: 2006).*

G.F. Lorusso et al., "Advanced DFM application using design-based metrology on CD SEM," 2006 Proc. of SPIE vol. 6152, 14 pages. (Year: 2006).*

P. De Bisschop et al., "Alignment and averaging of scanning electron microscope image contours foroptixcal proximity correction modeling purposes," J. Micro/Nanolith. MEMS MOEMS 9(4), 2010 SPIE, 10 pages. (Year: 2010).*

D.S.S. Bhardwaj et al., "QoR analysis of fractured data solutions using distributed processing," 2011 Proc. of SPIE vol. 8166, 12 pages. (Year: 2011).*

S. Berthiaume et al., "Automated SEM recipe generation for OPC applications," 2012 Proc. of SPIE vol. 8324, 13 pages. (Year: 2012).*

P. Brooker et al., "Design-based metrology for development and manufacturing applications," 2013 Proc. of SPIE vol. 8681, 11 pages. (Year: 2013).*

F. Weisbuch et al., "Enabling scanning electron microscope contour-based optical proximity correction models," J. Micro/Nanolith. MEMS MOEMS 14(2), 2015 SPIE, 12 pages. (Year: 2015).*

A. Miyamoto et al., "Automatic Generation of Imaging Sequence for CD-SEM Using Design Data," Electronics and Communications in Japan, vol. 99, No. 9, 2016 Wiley Periodicals, pp. 62-71. (Year: 2016).*

C. Hsiang et al., "Pattern centric design based sensitive patterns and process monitor in manufacturing," 2017 Proc. of SPIE vol. 10145, 11 pages. (Year: 2017).*

D. Hibino et al., "High-Accuracy optical proximity correction modeling using advanced dimension scanning electron microscope-based contours in next-generation lithograph," 2011 SPIE, J. Micro/Nanolith. MEMS MOEMS, vol. 10, No. 1, pp. 1-8. (Year: 2011).*

* cited by examiner

WAFER-TO-DESIGN IMAGE ANALYSIS (WDIA) SYSTEM

CROSS REFERENCE TO RELATED APPLICATION

This application claims priority of U.S. Provisional Patent Application No. 62/719,357 filed on Aug. 17, 2018, the entire contents of which are incorporated herein by reference.

BACKGROUND

Traditionally, qualifying an image of, e.g., a circuit pattern formed over a wafer obtained using a scanning electron microscope (SEM) is labor-intensive and time-consuming. Engineers have to manually create a measurement job. After acquiring an image, the image is qualified manually by analyzing the measurement results. A more efficient and thorough image qualification process is desirable.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
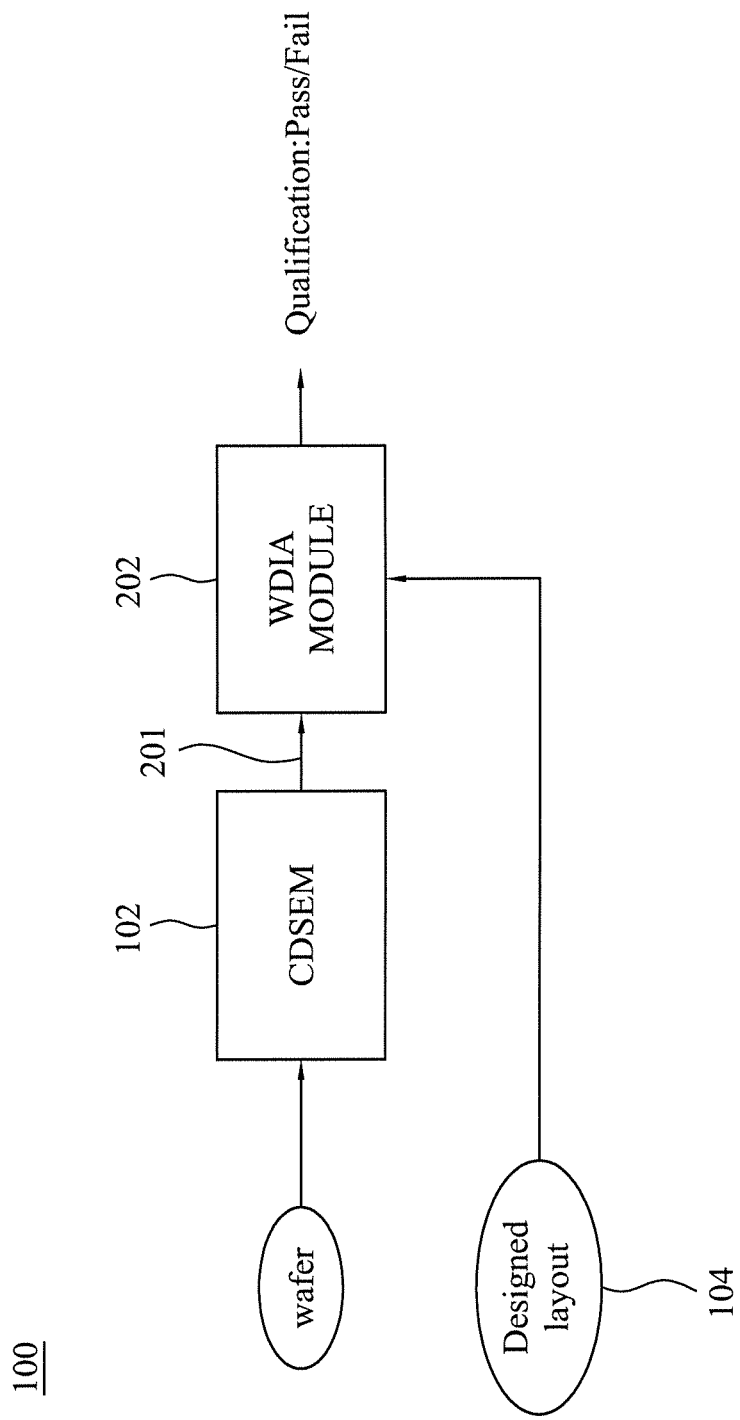
FIG. 1 illustrates schematic overview of an SEM image qualification process, according to embodiments of the present disclosure.

It is to be understood that the following disclosure provides many different embodiments, or examples, for implementing different features of the disclosure. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

The critical dimension SEM (CD-SEM) is used as a measuring apparatus to inspect the workmanship of various patterns by measuring the patterns formed on semiconductor wafers. In an SEM apparatus, such as the CD-SEM, dimensionally critical points on the semiconductor patterns are inspected and observed as end measuring points through the SEM, then various dimensional data of the patterns, such as pattern widths, are measured from the images acquired during the observation process, and the dimensional data is monitored to detect changes in process conditions.

In SEM image qualification, the SEM image is obtained based on a recipe (also referred to as a measurement job), created by the SEM operator. The SEM image may be automatically obtained according to the recipe. A recipe creation relies on the operator's capability to interpret the layout, and then register the location on the wafer to be measured in the recipe with the corresponding measurement settings. The analysis of the measurement results vary depending on the different applications, layers, and gauge-types. Thus, different recipes provide a different analysis results, and the image analysis is dependent on the quality of the SEM image obtained.

Embodiments disclosed are directed to a polygon-based layout analysis method to extract and categorize meaningful measurement locations on the wafer. The method uses automated gauge placement techniques to place gauges on the measurement locations with appropriate measurement parameters. The analysis method includes image-to-GDS (Graphic Database System (file format)) alignment, a measurement kernel, and a layer/gauge-dependent judgment flow to obtain a fully automated wafer SEM image qualification. The disclosed method advantageously provides a fully automated, full field-of-view wafer SEM image qualification. Additionally, the layer/gauge-dependent judgment flow can be customized for different applications. An image qualification process that is not dependent on SEM operators, and a more standardized image qualification process have been desired. According to some embodiments of the present disclosure, measurement points in circuit patterns formed over a substrate are automatically determined based on a pattern layout of the circuit patterns.

FIG. 1 illustrates schematic overview of an SEM image qualification process 100, according to embodiments of the present disclosure. As illustrated, a semiconductor wafer having desired circuit patterns implemented thereon is provided into a SEM apparatus at 102. In an embodiment, a Critical Dimension SEM (CD-SEM) is used to obtain an image of the patterns of the circuit patterns implemented on the semiconductor wafer. The CD-SEM outputs an image 201 of the circuit pattern. The image includes the image of the entire circuit in some embodiments or, in other embodiments, the image includes the image of one or more areas (locations) of the circuit as specified by the operator. The CD-SEM image 201 is provided to a wafer-to-design image analysis (WDIA) module 202, according to embodiments disclosed herein. In an embodiment, the WDIA module 202 is implemented in software as a computer executable program code that is executed by a processor. In other embodiments, the WDIA module 202 is implemented in hardware as logic gates. In yet other embodiments, the WDIA module 202 is implemented as a combination of hardware and software. In addition, the WDIA module 202 also provided with the designed circuit layout 104 (e.g., a GDS file) of the circuit of which the CD-SEM image 201 is provided to the WDIA module 202. The WDIA module 202 qualifies the CD-SEM image 201 based on the designed circuit layout 104. By analyzing the image, a determination can be made of whether the circuit pattern implemented on the semiconductor wafer is acceptable, e.g., within the desired range. The circuit pattern is considered acceptable if it satisfies specified design parameters. For example, a circuit pattern implemented on the semiconductor wafer is considered acceptable if the distance between adjacent circuit lines is equal to or within a desired error margin of the distance between the adjacent circuit lines in the designed layout. In another example, a circuit pattern is considered acceptable if the line width in the circuit pattern implemented on the semiconductor wafer is equal to or within a certain error margin of the line width in the designed layout.

Figure 2:
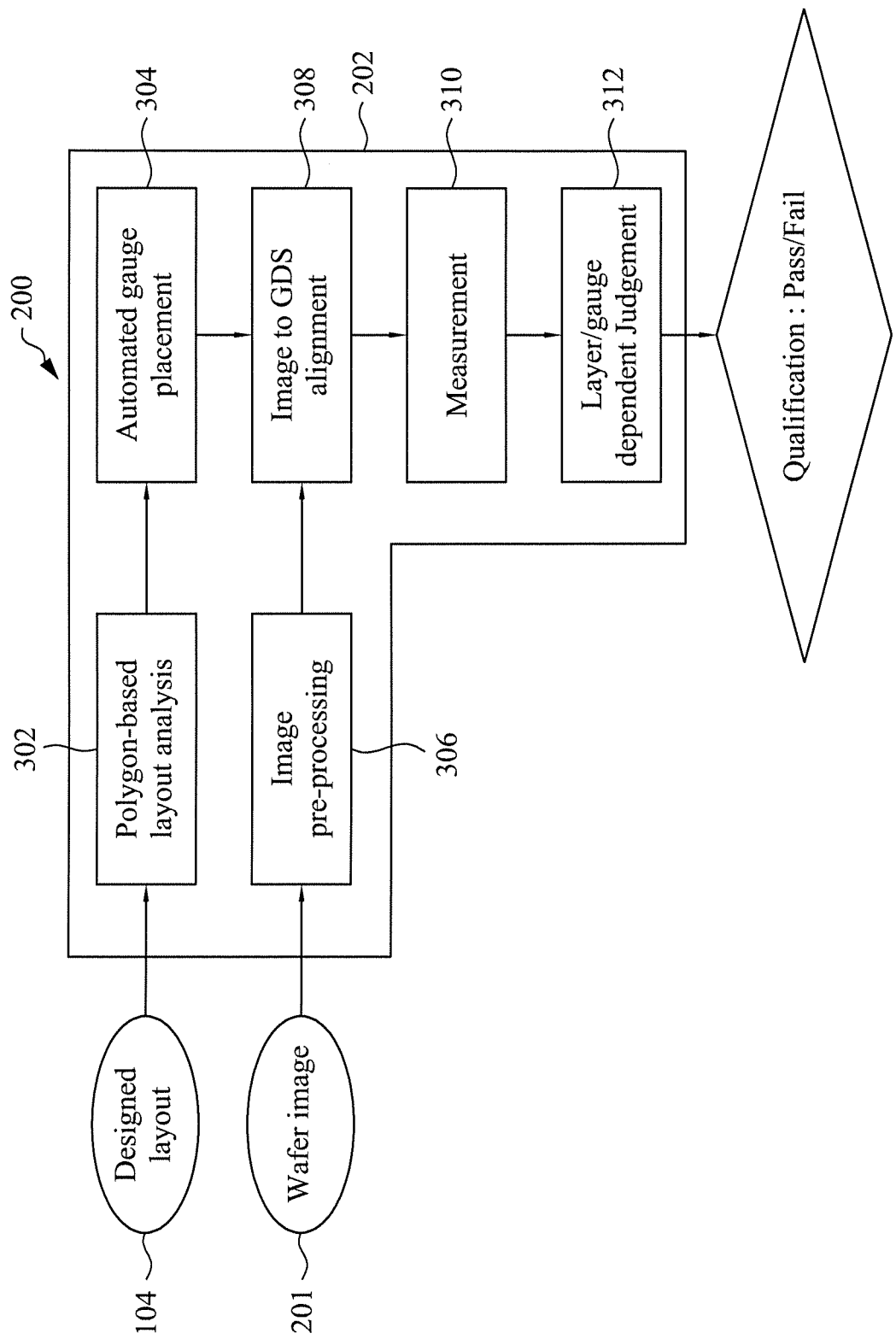
FIG. 2 illustrates a process flow performed by the wafer-to-design image analysis (WDIA) module for qualifying an image, according to some embodiments of the present disclosure.

FIG. 2 illustrates a process flow 200 performed by the wafer-to-design image analysis (WDIA) module 202 for qualifying an image, according to some embodiments of the present disclosure. As illustrated, the WDIA module 202 includes the operations of polygon-based layout analysis 302, automated gauge placement 304, image pre-processing 306, image to GDS alignment 308, measurement 310, and layer/gauge dependent judgement 312. Initially, the operations of polygon-based layout analysis 302 and automated gauge placement 304 are performed on the designed layout 104 of the circuit. In some embodiments, the designed layout 104 is considered implemented in a GDS file format (or a GDSII file format). However, in other embodiments, the designed layout 104 is implemented as an OASIS (Open Artwork System Interchange Standard) file format.

Figure 3:
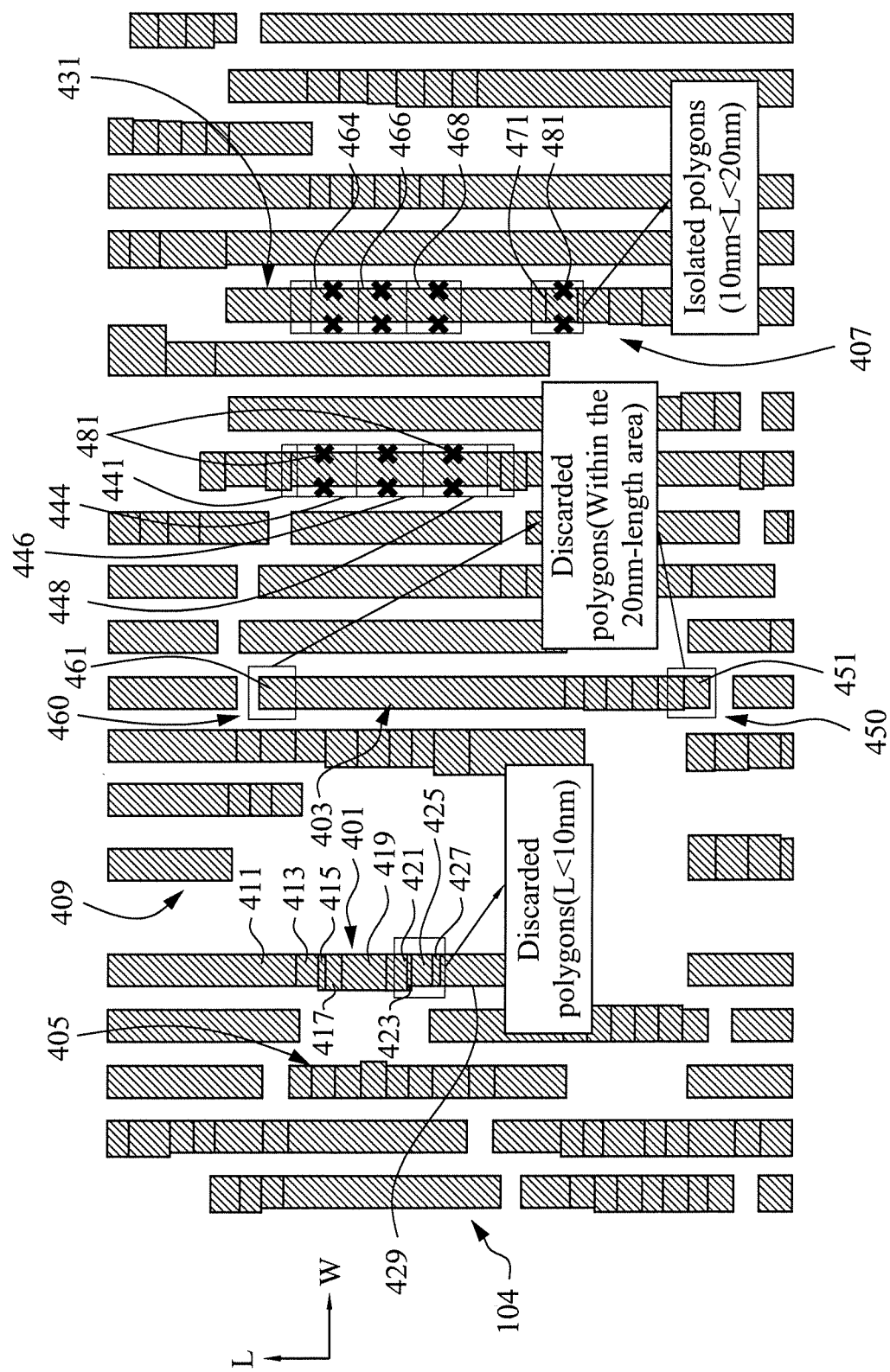
FIG. 3 illustrates the results of operations of the polygon-based layout analysis and the automated gauge placement, according to some embodiments of the present disclosure.

The operations of the polygon-based layout analysis 302 and the automated gauge placement 304 are explained with reference to FIG. 3. As illustrated in FIG. 3, the layout 104 includes multiple patterns each including one or more polygons. Some of the patterns are labelled in FIG. 3 as patterns 401, 403, 405, 407, and 409. For instance, pattern 401 is constituted by a plurality of polygons 411, 413, 415, 417, 419, 421, 423, 425, and 427. The plurality of polygons 411, 413, 415, 417, 419, 421, 423, 425, and 427 are substantially rectangular or square in shape and are arranged in an end to end fashion in the length (L) direction. In an embodiment, the patterns 401, 403, 405, 407, and 409 have equal lengths. However, in other embodiments, the patterns 401, 403, 405, 407, and 409 have different lengths. The patterns (e.g., patterns 401, 403, 405, 407, and 409) in the layout 104 include polygons (e.g., polygons 411, 413, 415, 417, 419, 421, 423, 425, and 427 in pattern 401) of different lengths. Alternatively, some or all of the polygons can have the same length. Further, a pattern of polygons can include polygons having different widths. Alternatively, a pattern of polygons can include polygons having the same widths (W). In some embodiments, based on the orientation of FIG. 3, the length (L) is the vertical dimension, while the width is the horizontal dimension.

During polygon-based layout analysis 302, the provided layout 104 is analyzed to identify portions of the layout 104 that satisfy a length criterion or an aspect ratio criterion. The layout 104 then undergoes an automated gauge placement operation 304 that inserts (or otherwise places) measurement gauges on the polygons based on gauge placement rules. Portions of the layout 104 that are to be processed using the polygon-based layout analysis 302 and the automated gauge placement 304 are identified (or otherwise provided) by the user. As used herein, "gauge" refers to a region-of-interest on the layout 104 with a gauge-type (line/space/hole/island) and its corresponding measurement settings. In an embodiment, a gauge-type is determined by the polygon-based layout analysis 302. If a polygon has an aspect ratio less than or equals to a threshold value (e.g., 2), then such a polygon is identified as a hole object and it is considered that the polygon represents a hole (or an island) in the wafer image 201. The automated gauge placement 304 places a gauge on each hole (or island), in which a gauge is consisted of a gauge-type, a region-of-interest, and a corresponding measurement settings.

When a polygon is identified as a hole object, a hole-type gauge is placed on the polygon. After the image to GDS alignment (operation 308 discussed below), the region-of-interest on layout 104 is mapped onto the aligned wafer image (for example, image 523 in FIG. 7 below) and then used by the measurement operation 310 (discussed below) to crop a sub-image (operation 802 in FIG. 8A, discussed below).

When a polygon has an aspect ratio larger than the threshold value, the polygon is considered as line (or space) pattern. A line-type gauge (or space-type gauge) is placed on each of the grouped polygons and isolated polygons (discussed below) with a corresponding region-of-interest. After the image to GDS alignment 308, the region-of-interests of the line-type gauges (space-type gauges) on layout 104 are mapped onto the aligned wafer image (image 523 in FIG. 7 below) and then used by the measurement operation 310 (discussed below) to crop a sub-image (operation 902 in FIG. 9A, discussed below).

In some embodiments, the polygon-based layout analysis 302 identifies polygons having lengths less than a first threshold dimension, for example, 10 nm. For instance, polygons 423, 425, and 427 are determined by the polygon-based layout analysis 302 to each have a length less than 10 nm. However, it should be noted that the 10 nm first threshold dimension is a design choice and embodiments are not limited thereto. In other embodiments, the first threshold dimension can be set at about 5 nm to about 20 nm, in some embodiments. Polygons 423, 425, and 427 having lengths less than the first threshold dimension are identified as discarded polygons in FIG. 3. A polygon lying within a second threshold dimension, e.g., 20 nm lengthwise distance from an end of a pattern including the polygon is also identified as a discarded polygon. The second threshold dimension can be set at about 10 nm to about 30 nm, in some embodiments. For example, polygon 451 in pattern 403 lies within 20 nm lengthwise distance from an end 450 of the pattern 403, and is identified as a discarded polygon. In addition, a portion of a polygon that is within 20 nm lengthwise distance from an end of a pattern including the polygon is also discarded. For example, the portion 461 of the pattern 403 lies within 20 nm from the end 460 of the pattern 403 and is identified as a discarded polygon portion.

As discussed below, the automated gauge placement operation 304 ignores the discarded polygons or discarded polygon portions identified during the polygon-based layout analysis 302 when performing gauge placement. Stated otherwise, a measurement gauge is not placed in the discarded polygon or the portion that is within the threshold (e.g., 20 nm) distance. A reason for this is that the mask features representing the end of the pattern are not reproduced correctly during exposure. For instance, the shape of the pattern at the end will be reproduced as rounded or elliptical instead of a sharp edge. It should be noted that gauges can be placed on other polygons in the pattern or remaining portions of the pattern if the polygons or the remaining portions satisfy the length criteria discussed below. Thus, it is understood that the entire polygon is not discarded in some embodiments.

The polygon-based layout analysis 302 identifies polygons having lengths greater than a lower threshold dimension, e.g., 10 nm and less than an upper threshold dimension, e.g., 20 nm (10 nm<L<20 nm). These are referred to as isolated polygons. The automated gauge placement operation 304 places a single gauge (indicated by 'X') on opposite sides of each isolated polygon. As illustrated in FIG. 3, the polygon 471 is identified as an isolated polygon and a measurement gauge 481 is placed on each opposite side of the polygon 471 in a lengthwise direction.

The polygon-based layout analysis 302 identifies polygons having lengths greater than the second threshold dimension, e.g., 20 nm. For each such polygon, the polygon-based layout analysis 302 divides the polygon into segments. In an embodiment, length of each segment is between 8 pixels and 96 pixels. In other embodiments, the length of each segment is between 16 pixels and 84 pixels. In still other embodiments, each segment is 32 pixels in length. It should be understood that the segment length is a design choice and can be increased or decreased as per design and application requirements. The segment length can also be selected based on processing capabilities of a controlling system (e.g., system 1100, FIG. 11). In some instances, a lower pixel length increases processing time, but requires less memory, while a higher pixel length decreases processing time, but requires more memory.

The segments in each polygon have the same width. Such a polygon is referred to as a grouped polygon. The automated gauge placement operation 304 places a single gauge on opposite sides of each segment of the grouped polygon.

FIG. 3 illustrates a grouped polygon 441 including segments 444, 446, and 448, each having a same width. Gauges 481 are then placed in each segment 444, 446, and 448. Two or more gauges may be placed in each segment. However, it should be noted that the grouping is not restricted to polygons from a same pattern. Polygons having the same width, but spaced part, are also grouped together in some embodiments. For example, segments 464, 466, and 468 from pattern 431 having the same width as segments 444, 446, and 448 are grouped together with segments 444, 446, and 448. Alternatively, polygons from the same pattern are categorized into different groups if the polygons have a different width than other polygons of the pattern.

It should be noted that the different polygons and polygon portions are first identified in the provided layout 104 by the polygon-based layout analysis 302, and then the layout 104 with the different polygons and polygon portions identified is provided to the automated gauge placement operation 304. It should be noted that the 10 nm and 20 nm polygon lengths discussed in the above embodiments are examples. In other embodiments, the polygon lengths can be increased or decreased as per design and application requirements.

The layout 104 with the placed gauges is then provided to the image to GDS alignment operation 308. The image to GDS alignment operation 308 is also provided with the CD-SEM image 201 of the circuit pattern. Preprocessing is performed on the CD-SEM image 201 in the image pre-processing operation 306. The image pre-processing 306 operation improves the quality of the CD-SEM image 201 for processing by the image to GDS alignment operation 308 and other components in the WDIA module 202. For example, image pre-processing includes suppressing unwanted distortions or enhancing some image features that are required for further processing.

Figure 4:
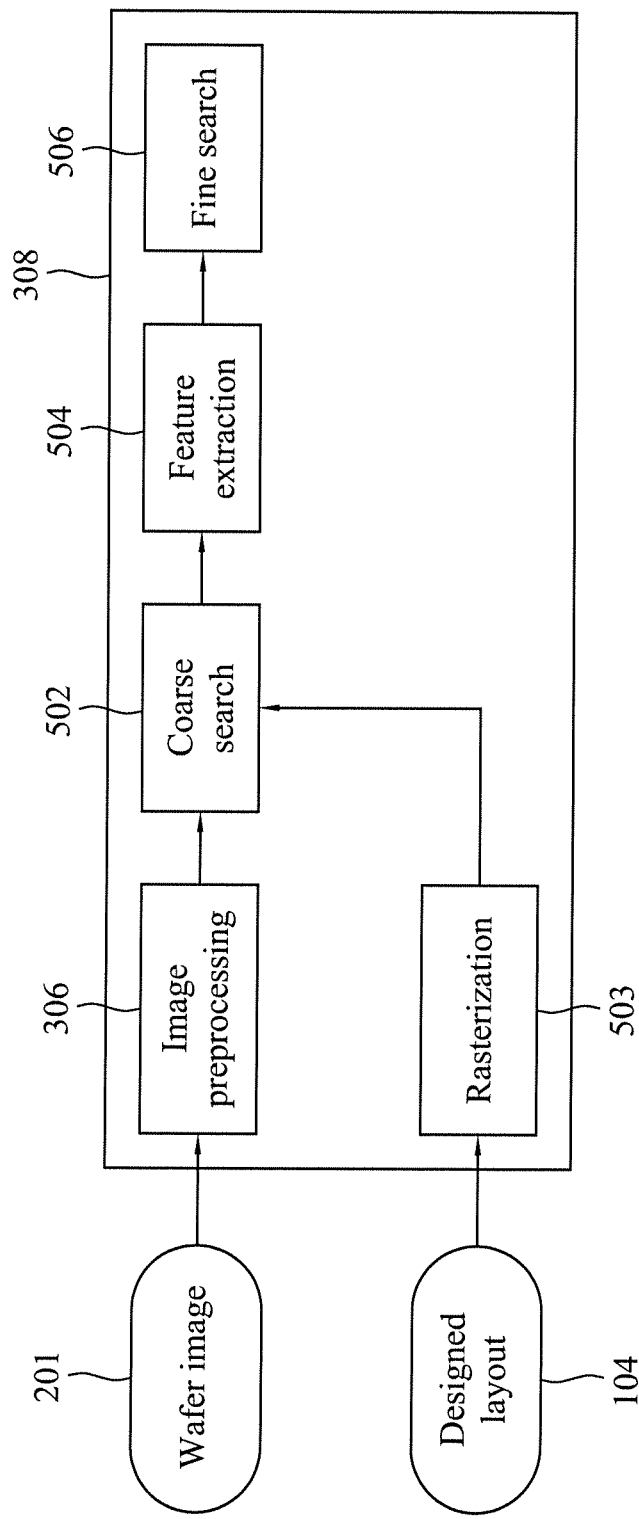
FIG. 4 illustrates the process flow in the image to GDS alignment operation according to some embodiments of the present disclosure.

The image to GDS alignment 308 operation aligns the CD-SEM image 201 and the designed layout 104. FIG. 4 illustrates the process flow in the image to GDS alignment operation 308 according to some embodiments of the present disclosure. The image to GDS alignment operation 308 includes the operations of rasterization 503, coarse search 502, feature extraction 504, and fine search 506.

The coarse search operation 502 operates on the preprocessed image output from the image pre-processing operation 306 and a binary image of the design layout 104 as obtained from the rasterization operation 503. In the image pre-processing operation 306, an average filter is applied to smooth out the noises of the wafer image 201. The rasterization operation 503 is performed on the layout 104 for obtaining a raster image of the layout 104. The raster image is then converted into a binary image of the layout 104. A binary image is a digital image that has only two possible values for each pixel. The two colors used for a binary image are black and white in some embodiments.

Figure 5A:
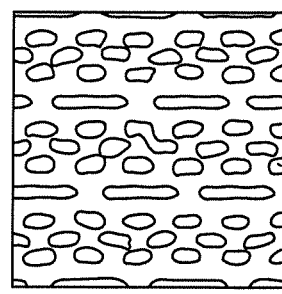
FIG. 5A illustrates a CD-SEM image and a corresponding pre-processed image output from the image pre-processing operation.
Figure 5A:
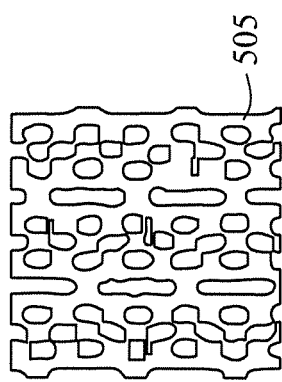
Figure 5B:
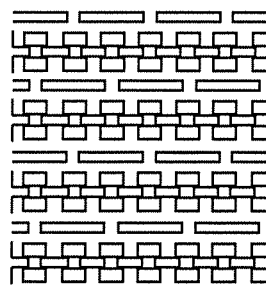
FIG. 5B illustrates an example design layout and the corresponding binary image obtained from the rasterization operation.
Figure 5B:
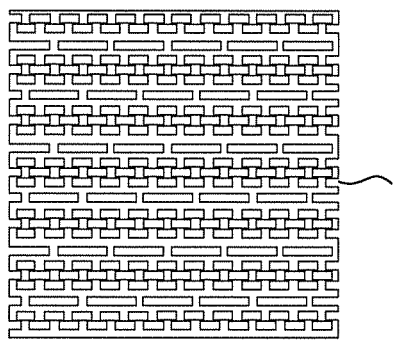

Referring briefly to FIG. 5A, illustrated are an example the CD-SEM image 201 and a corresponding binary wafer image 505. Illustrated in FIG. 5B are an example layout 104 and the corresponding binary image 501 obtained from the rasterization operation 503. The coarse search operation 502 processes the pre-processed image 511 with a series of morphological operations, followed by the Otsu thresholding to obtain a binary wafer image 505, and then aligns the binary wafer image 505 with the binary image 501.

Typically, the layout 104 is larger in size (dimension) compared to the wafer image 201. The binary image 501 is also larger than the binary wafer image 505. In an embodiment, in order to align the binary wafer image 505 with the binary image 501, the binary wafer image 505 is moved (or otherwise adjusted) over the binary image 501 until a location is found where the cross-correlation of the binary wafer image 505 and the binary image 501 is minimized. Once the binary wafer image 505 and the binary image 501 are aligned, the binary image 501 around the binary wafer image 505 is cropped (cut) to obtain a cropped GDS image 521 (See FIG. 7).

Figure 6:
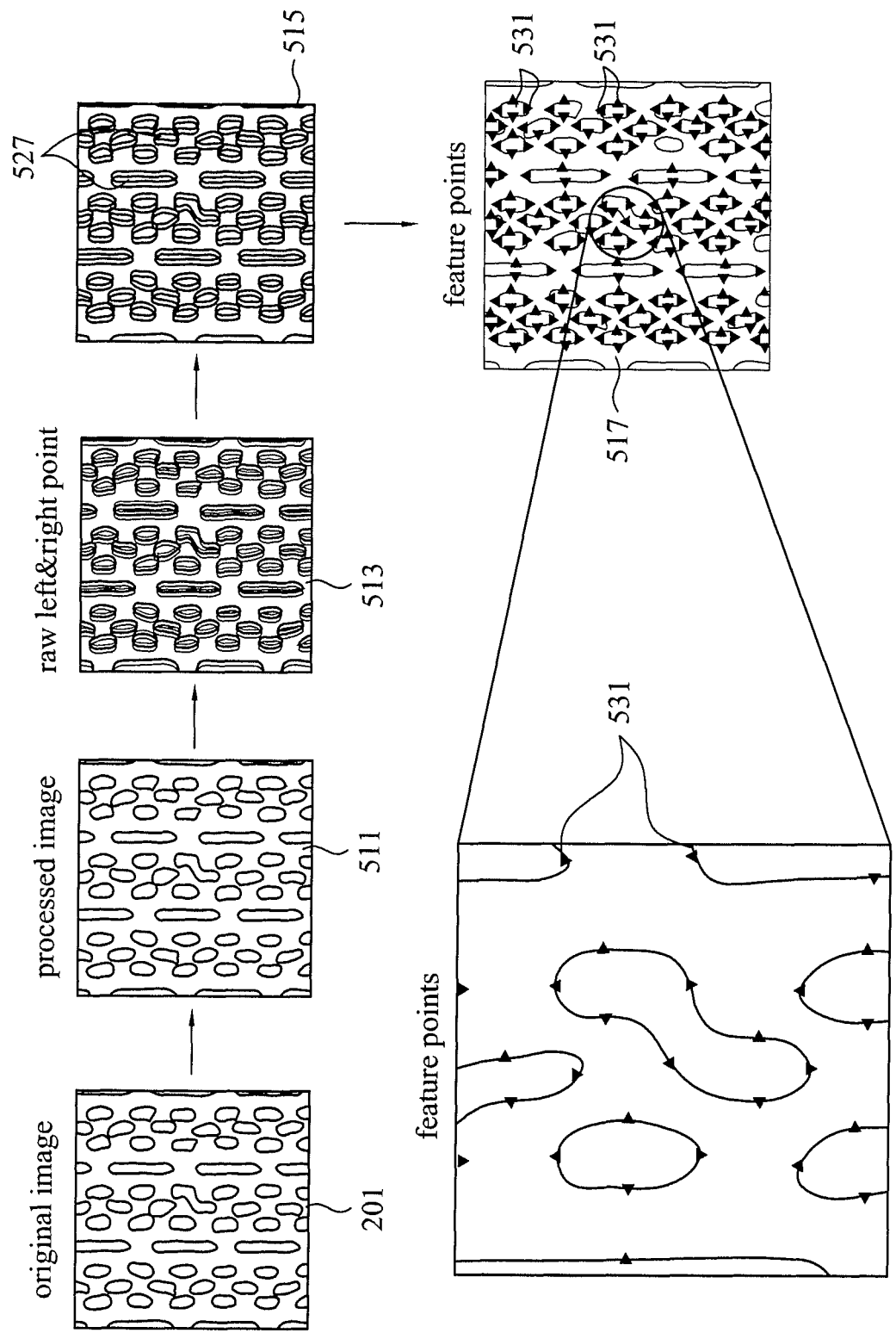
FIG. 6 illustrates the images obtained from the different processing steps performed during the feature extraction operation according to embodiments of the present disclosure.

Returning to FIG. 4, after alignment, the wafer image 201 is provided to the feature extraction operation 504, wherein the wafer image 201 is further processed. FIG. 6 illustrates the images obtained from the different processing steps performed during the feature extraction operation 504 according to embodiments. The feature extraction operation 504 applies edge detection algorithms onto the pre-processed image 511, and then identifies left and right points on each object (e.g., holes, line/space in the wafer image 201) in the processed image 511, as illustrated in the image 513, wherein a left point is the rising edge along the horizontal intensity line and a right point is the falling edge along the horizontal intensity line. For the purposes of discussion herein, the circuit features on the semiconductor wafer are referred to as objects in the image of the circuit pattern. Thus, for each feature there is a corresponding object on the wafer image. The image 513 is filtered to obtain image 515. In image 513, each object contains of four edge-lines, the left point of the left edge, the right point of the left edge, the left point of the right edge, and the right point of the right edge. The two inner edge lines in image 513 are merged to form the center lines 527.

Feature points are then inserted on each object in the image 515. In an embodiment, feature points are inserted on the top, bottom, left, and right sides of each object. A resultant image 517 is illustrated including feature points 531. A close up view of a portion in image 517 illustrates the feature points 531 on the different objects in detail.

Figure 7:
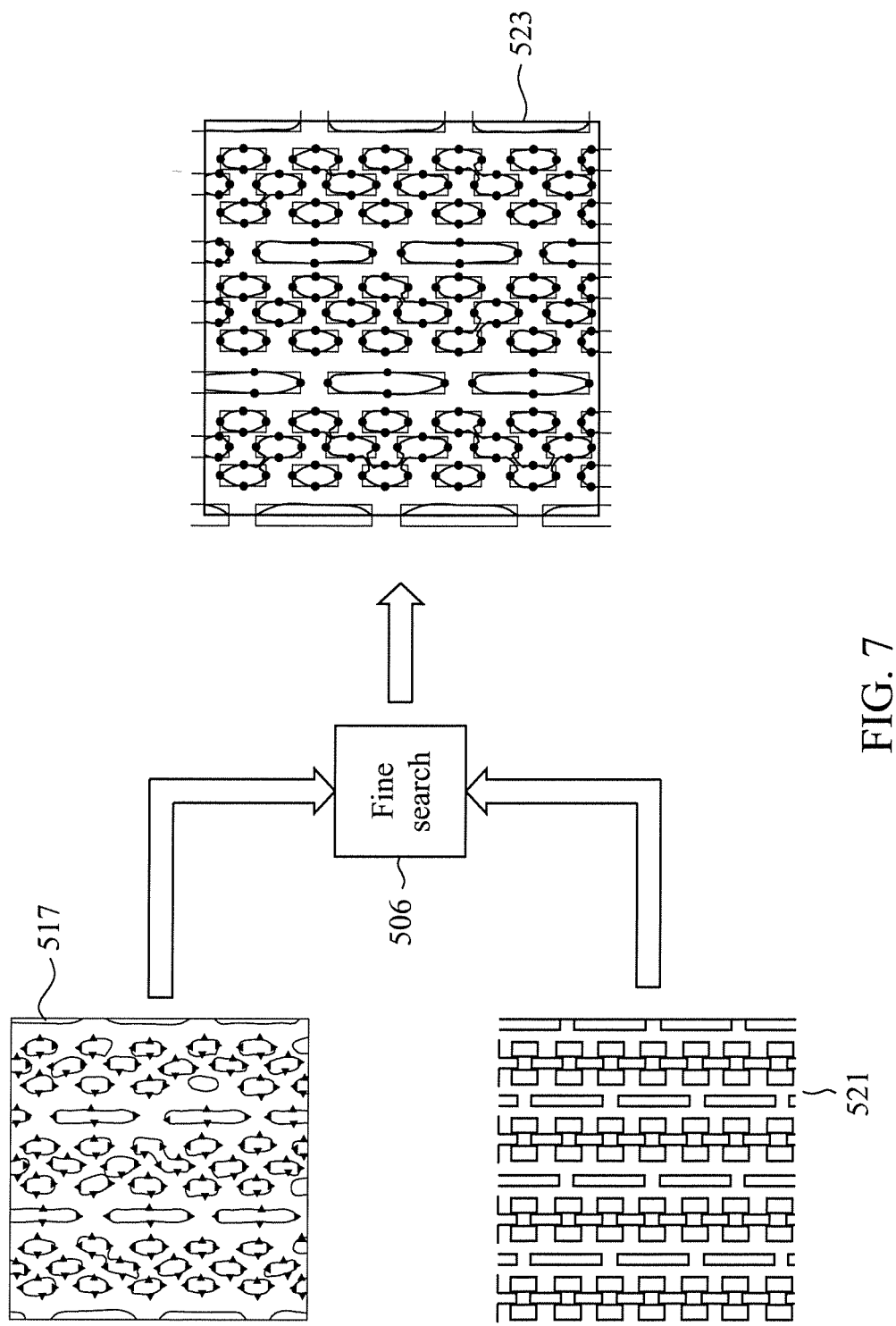
FIG. 7 illustrates a fine search operation wherein the image from the feature extraction operation is aligned with a cropped GDS image according to embodiments of the present disclosure.

The image 517 is then provided to the fine search operation 506 for further processing. FIG. 7 illustrates a fine search operation 506 wherein the image 517 is aligned with the cropped GDS image 521 to obtain a fine matched image 523. The image 517 and the cropped GDS image 521 are aligned to map the region-of-interest on layout 104 onto the aligned wafer image 523. The measurement operation 310 then crops a sub-image (802 in FIG. 8A) for use in the measurement processes. Stated otherwise, image 523 is the wafer image 201 with the regions-of-interest marked on it. Measurement operation 310 is then performed on the fine matched image 523.

The measurement operation 310 determines the size, e.g., the critical dimension (CD) of each object on the wafer image 201. Depending on an aspect ratio, the each object on the wafer image 201 is recognized either as a line/space or a hole (via) during measurement operation 310.

Figure 8A:
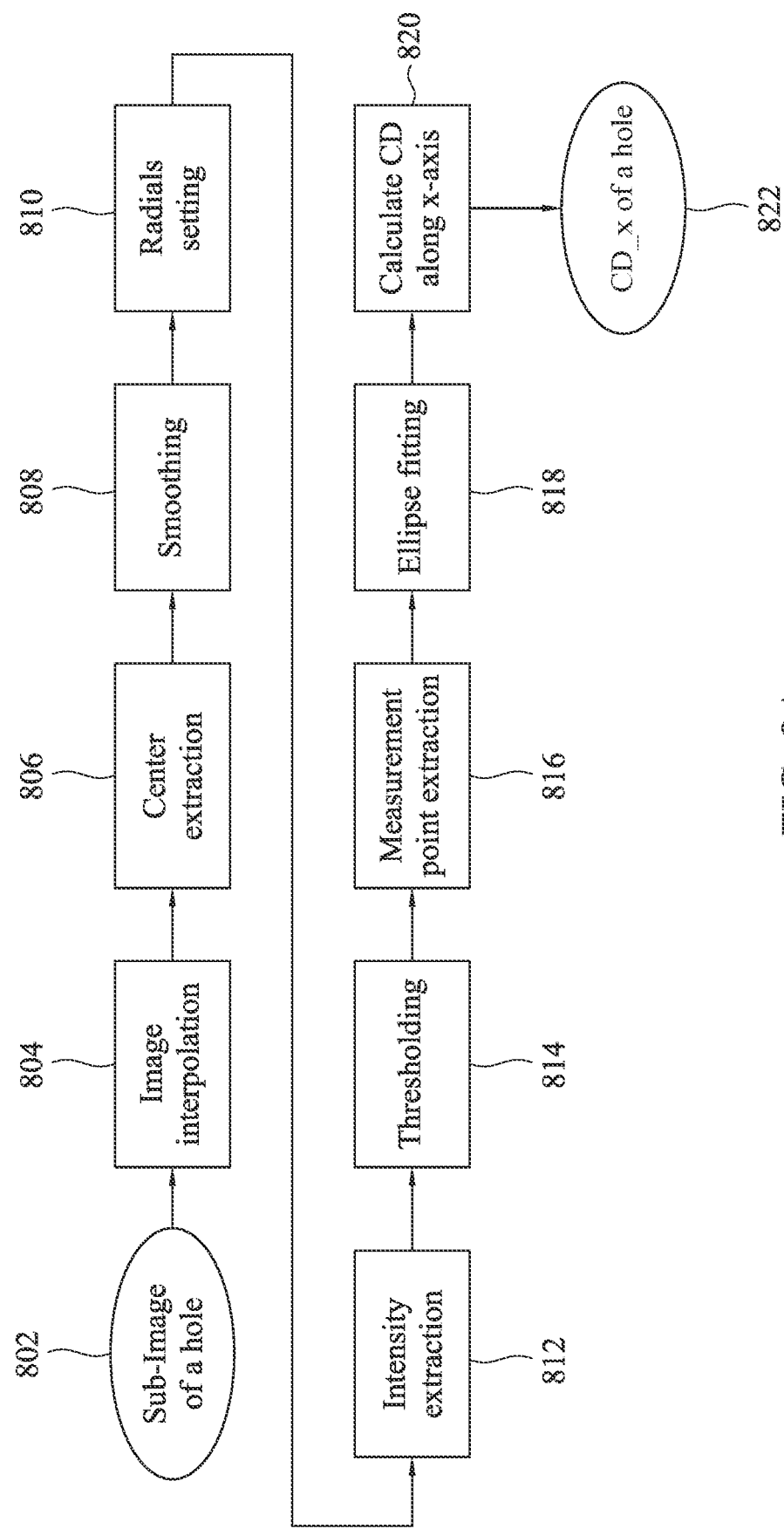
FIG. 8A illustrates a process flow performed during the measurement operation when the object is identified as a hole, according to embodiments of the present disclosure.
Figure 8B:
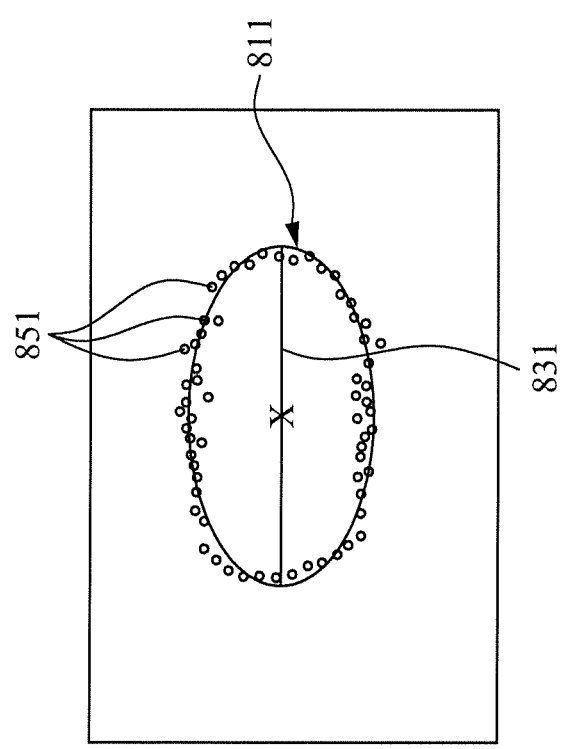
FIG. 8B illustrates the intersection points determined during the measurement operation of FIG. 8A.

FIG. 8A illustrates a process flow 800 performed during the measurement operation 310 when the object is identified as a hole, according to embodiments. Each hole in the image 523 is analyzed individually to determine its critical dimension. Operation 802 includes obtaining a sub-image by extracting an image of a hole for analysis from the fine matched image 523. Image interpolation is then performed on the image, in operation 804. In an embodiment, during image interpolation, intensity values of one or more locations of the image are determined. In operation 806, the center of the hole is extracted. Briefly, active contour modeling is used to find a closed contour from the interpolated image. Then, the center of the hole object is obtained by calculating the center-of-mass of the closed contour. In operation 808, the image is smoothened, and radials setting is performed in operation 810. During radials setting, the hole is divided into 32 radials (or slices) and an edge of the hole in each radial is determined. An intensity extraction operation is performed at 812. During the intensity extraction operation, an intensity line is extracted along each radial from the center to the image border. Referring to FIG. 8B, an image of a hole is illustrated, e.g., obtained from the image 523. As seen, along the edges, the "inside" the hole is darker than the "outside" of the hole, thus indicating different intensity values. A thresholding operation is then performed at 814. In the thresholding operation, a threshold is determined for each intensity line. The threshold is calculated as the mean value of the maximum intensity and the minimum intensity along the intensity line.

At operation 816, a measurement point extraction operation is performed, wherein an inner edge point in each radial intensity line is determined. The inner edge point is the first intersection point, starting from the center, where the intensity is greater than the threshold determined at 814. FIG. 8B illustrates the intersection points 851. An ellipse 811 is fitted along the intersection points 851, in operation 818. The major axis of the ellipse is measured, at operation 820, and this is determined to be the critical dimension (CD) 831 of the hole, as at operation 822. The measurement operation 310 is repeated for each hole in the image.

Figure 9A:
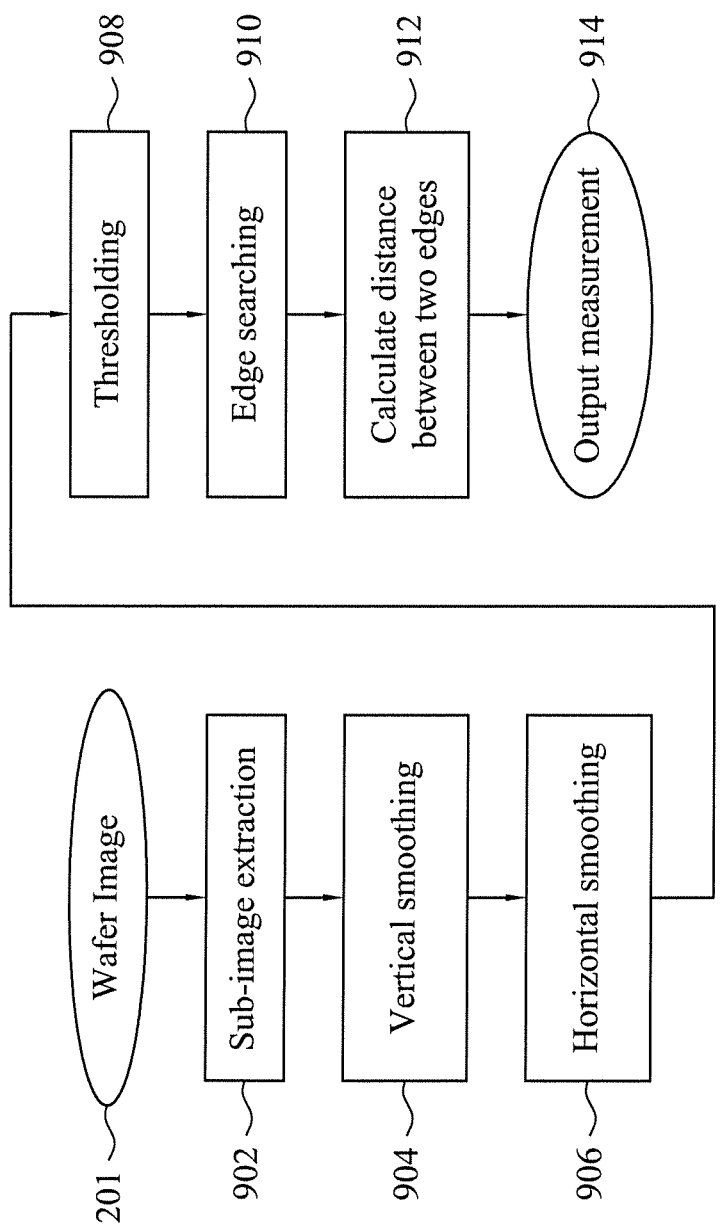
FIG. 9A illustrates a process flow performed during the measurement operation when the object is identified as a line (or space), according to embodiments of the present disclosure.
Figure 9B:
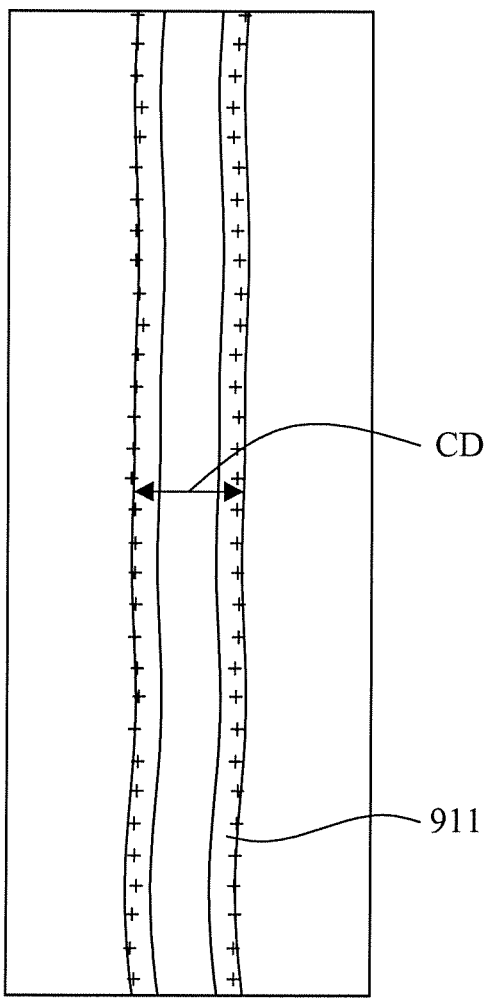
FIG. 9B illustrates the intersection points determined during the measurement operation of FIG. 9A.

FIG. 9A illustrates a process flow 900 performed during the measurement operation 310 when the object is identified as a line (or space), according to embodiments. Each line (or space) in the image 523 is analyzed individually to determine its critical dimension. In some embodiments, the process flow 900 is described with reference to measuring the critical dimension of a line. It will be understood that operations described are equally applicable to measuring the critical dimension of a space. Operation 902 includes extracting an image of a line for analysis from the fine matched image 523. Vertical smoothing and horizontal smoothing operations are performed, at operations 904 and 906, respectively. A thresholding operation is then performed at operation 908. In the thresholding operation, the smoothed image is vertically averaged to form a horizontal intensity line. The threshold is calculated as the mean value of the maximum intensity and the minimum intensity along the intensity line. Edges of the line are then determined, at operation 910. Referring to FIG. 9B, an image of a line 911 is illustrated, e.g., obtained from the image 523. As seen, along the edges, the inside of the line is darker than the outside of the line, thereby indicating different intensity values. The edges are determined to be locations where the intensity line intersects the threshold. A distance between the edges is calculated at operation 912. This distance is then determined to be the individual critical dimension (ind_CD) of the line (or the segment in the polygon) and is provided at operation 914.

Figure 10:
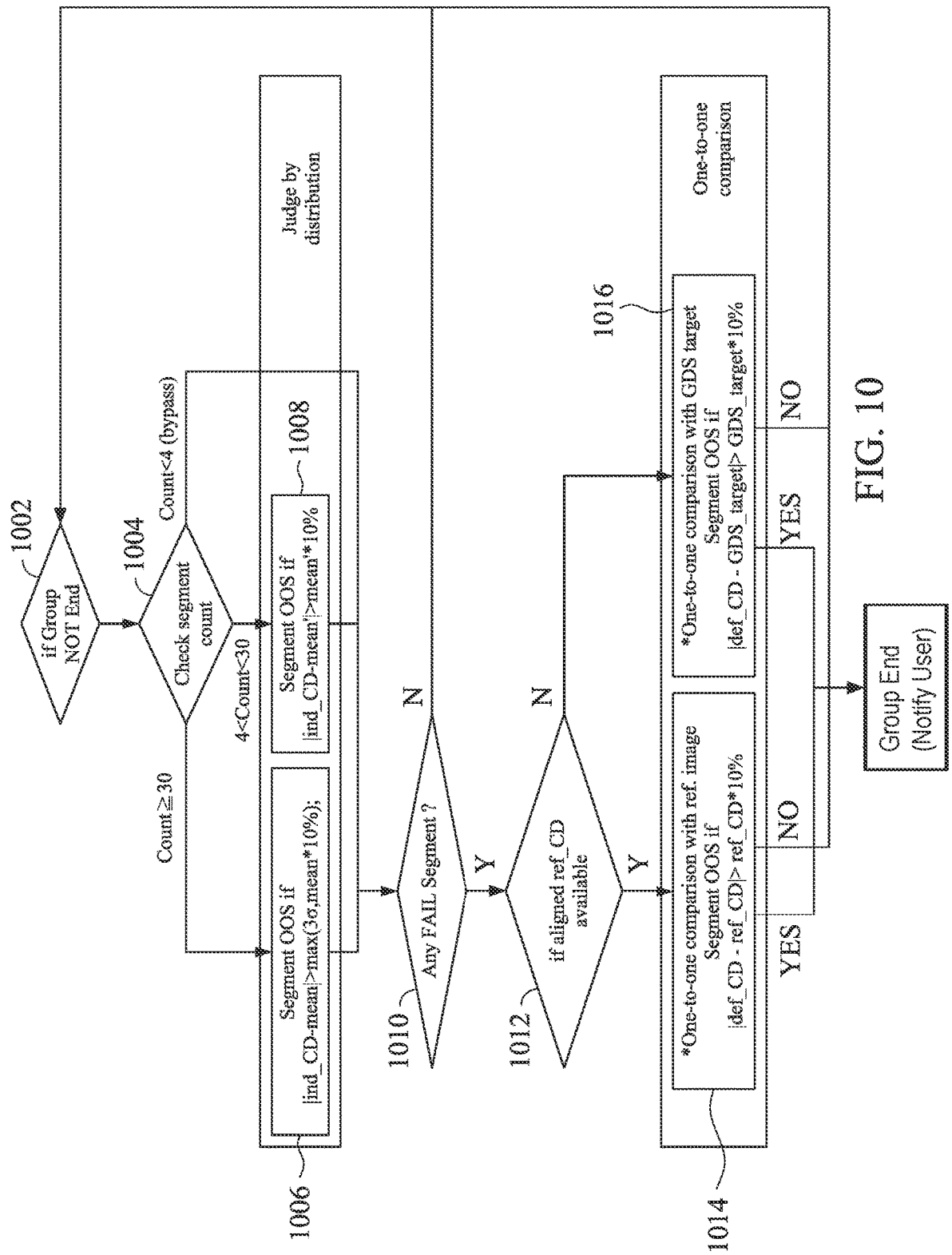
FIG. 10 is a process flow performed in the layer/gauge dependent judgement operation according to some embodiments of the present disclosure.

FIG. 10 is a process flow 1000 performed in the layer/gauge dependent judgement operation 312 according to some embodiments of the present disclosure. It is understood that additional operations can be provided before, during, and after processes discussed in FIG. 10 and some of the operations described below can be replaced or eliminated, for additional embodiments of the operations. The order of the operations/processes may be interchangeable and at least some of the operations/processes may be performed in a different sequence. At least two or more operations/processes may be performed overlapping in time, or almost simultaneously.

The layer/gauge dependent judgement operation 312 receives the output from the measurement operation 310. At operation 1002, the process flow begins by checking for groups including segments to be analyzed in the data received from the measurement operation 310. In an embodiment, the segments include segments 444, 446, 448, 464, 466, and 468 in FIG. 3. The number of segments in the group are counted at operation 1004. If the count is greater than or equal to a first threshold count, e.g., 30 (Count≥30), the process moves to operation 1006, wherein it is determined if each segment satisfies a designed target value. The designed target value can be the line width or line spacing or other specified design parameter. Specifically, in operation 1006, a normal distribution of the critical dimension of the segments is generated and a mean value of the critical dimension is obtained from the normal distribution. The mean value is subtracted from the critical dimension of an individual segment (ind_CD) and the result (absolute value) is compared with the maximum of 3σ (standard deviation of the mean) and the mean value*10%. An individual segment is identified as FAIL (referred to as Out Of Specification (OOS)) if the absolute value is greater than the maximum of 3σ (standard deviation of the mean) and a number that is mean value*10%. A FAIL indicates that the CD on the wafer is not within an acceptable value and indicates that the circuit feature has not been correctly exposed. Alternatively, a PASS indicates that the circuit feature has been correctly exposed.

If the count is greater than a second threshold count, e.g., 4 and less than the first threshold count 30 (4<Count<30), the process moves to operation 1008, wherein it is determined if each segment satisfies the designed target value, but under a different criteria compared to operation 1006. Specifically, in operation 1008, another distribution of the critical dimension of the segments is generated and a mean value of the critical dimension is obtained from the distribution. The mean value is subtracted from the critical dimension of an individual segment (ind_CD) and the result (absolute value) is compared with a number that is mean value*10%. An individual segment is determined as a FAIL if the absolute value is greater than the number.

As discussed, operations 1006 and 1008 of the process flow determine if an individual segment is a FAIL based on the distribution of the critical dimension of the segments. However, if the count is less than a third threshold count, 4 (Count<4), the number of segments is too small to generate a distribution.

The process flow moves to operation 1010, wherein it is determined if operation 1006 or operation 1008 indicates a FAIL segment. If operation 1006 or operation 1008 does not (N) indicate a FAIL segment, then process flow moves to operation 1002.

In operation 1010, it is checked if the operation 1006 or operation 1008 indicate a FAIL segment, or indicate the segments with group count ≤4. If any condition is true (Y) in operation 1010), then the process flow moves to operation 1012. In operation 1012, it is determined if a reference critical dimension (ref_CD) is available. If available (Y), then in operation 1014, an absolute value of the difference between an unacceptable (or less desirable) CD value (def_CD), i.e., an individual CD value that is a FAIL in operations 1006 or 1008, and the ref_CD is compared with a number that is 10%*ref_CD. If the absolute value is greater than the number (YES for operation 1014), the individual segment is considered as FAIL, else it is considered as PASS (NO for operation 1014).

In operation 1012, if it is determined that a reference critical dimension (ref_CD) is not available, then the process flow moves to operation 1016. In operation 1016, an absolute value of the difference between an unacceptable (or less desirable) CD value (def_CD), i.e., an individual CD value that is a FAIL in operations 1006 or 1008, and a GDS target value (GDS_target), i.e., a CD value of the polygon corresponding to the segment, is compared with a number that is 10%*GDS_target. If the absolute value is greater than the number (YES for operation 1016), the individual segment is considered as a FAIL, else it is considered as PASS (NO for operation 1016).

If any of the operations 1014 and 1016 results in a FAIL, then an indication is sent to the user (Group End (Notify User)). A FAIL indicates that the corresponding feature on the mask needs to be repaired before exposure. A user can then repair the mask to correct the feature. If the operations 1014 and 1016 result in a PASS, then it is determined that circuit pattern is implemented on the wafer as designed. The process is subsequently repeated for each group of segments (go back to operation 1002).

Figure 11:
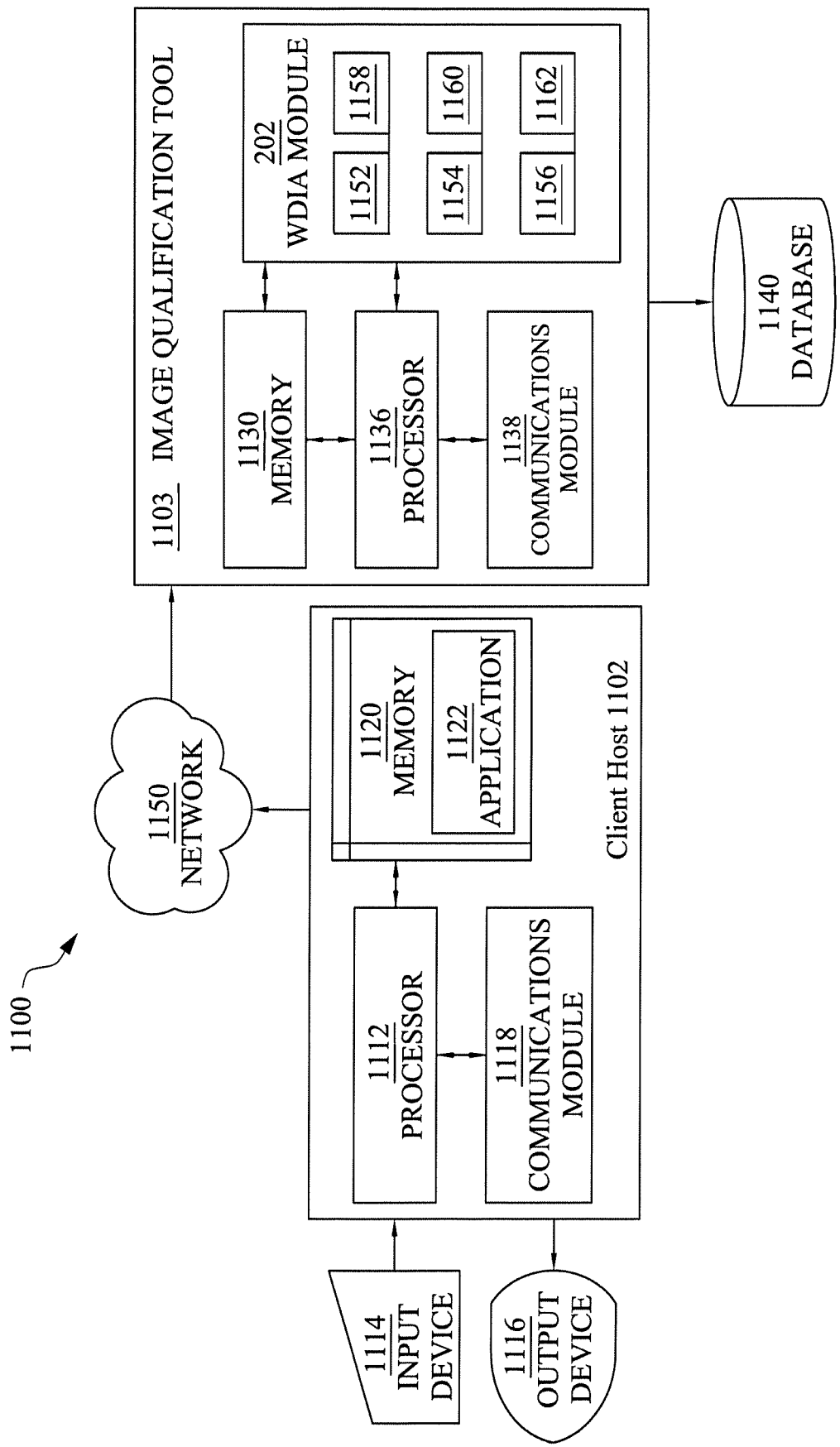
FIG. 11 illustrates a system configured to perform image qualification according to some embodiments of the disclosure.

FIG. 11 illustrates a system 1100 configured to perform image qualification according to some embodiments. A client host 1102 includes a processor 1112 configured to execute instructions stored in a memory 1120. Memory 1120 may include an application 1122, which includes commands that when executed by processor 1112 cause client host 1102 to perform methods consistent with the present disclosure. Application 1122 may include a runtime software program running on client host 1102 to issue commands to control an image qualification tool 1103 including the WDIA module 202. For example, the application 1122 includes an application to control the image qualification tool 1103 for performing image qualification using the WDIA module 202. Client host 1102 also includes a communications module 1118 that enables the client host 1102 to transfer data, provide commands and receive instructions from the image qualification tool 1103 through a network 1150. In some embodiments, the client host 1102 is coupled with an input device 1114 (e.g., a mouse, a keyboard, a touch screen display, and the like) and to an output device 1116 (e.g., a display, a speaker, and the like). Accordingly, a user of client host 1102 can enter commands and queries to the client host 1102 with the input device 1114, and receive graphic and other information from the client host 1102 via the output device 1116. In some embodiments, the application 1122 controls the input device 1114 and the output device 1116 through a graphic user interface (GUI), enabling a user to have access to the image qualification tool 1103 and perform image qualification.

The image qualification tool 1103 includes a memory device 1130, a processor 1136, and a communications module 1138 to transfer data, receive commands and provide instructions from client host 1102 through network 1150. In some embodiments, the WDIA module 202 includes sub-modules for implementing the different operations for performing a polygon-based layout analysis 302, automated gauge placement 304, image pre-processing 306, image to GDS alignment 308, measurement 310, and layer/gauge dependent judgement 312. As illustrated, the WDIA module 202 includes a polygon-based layout module 1152 for performing polygon-based layout analysis 302, an automated gauge placement module 1154 for performing automated gauge placement 304, an image pre-processing module 1156 for performing image pre-processing 306, an image to GDS alignment module 1158 for performing image to GDS alignment 308, a measurement module 1160 for performing measurement 310, and layer/gauge dependent judgement module 1162 for performing layer/gauge dependent judgement 312. Further, each of the operations of rasterization 503, coarse search 502, feature extraction 504, and fine search 506 in FIG. 4 are implemented using one or additional modules within the image to GDS alignment module 1158. In addition, the operations 802, 804, 806, 808, 810, 812, 814, 816, 818, 820, and 822 (FIG. 8A), and operations 902, 904, 906, 908, 910, 912, and 914 (FIG. 9A) are implemented using one or additional modules within the measurement module 1160. In an embodiment, the WDIA module 202 is implemented in software as a computer executable program code that is executed by the processor 1136. In other embodiments, the WDIA module 202 is implemented in hardware as logic gates. In yet other embodiments, the WDIA module 202 is implemented as a combination hardware/software. A database 1140 stores data results from operations performed by the image qualification tool 1103. In some embodiments, the database 1140 stores data required by the different modules to perform the respective operations.

Figure 12:
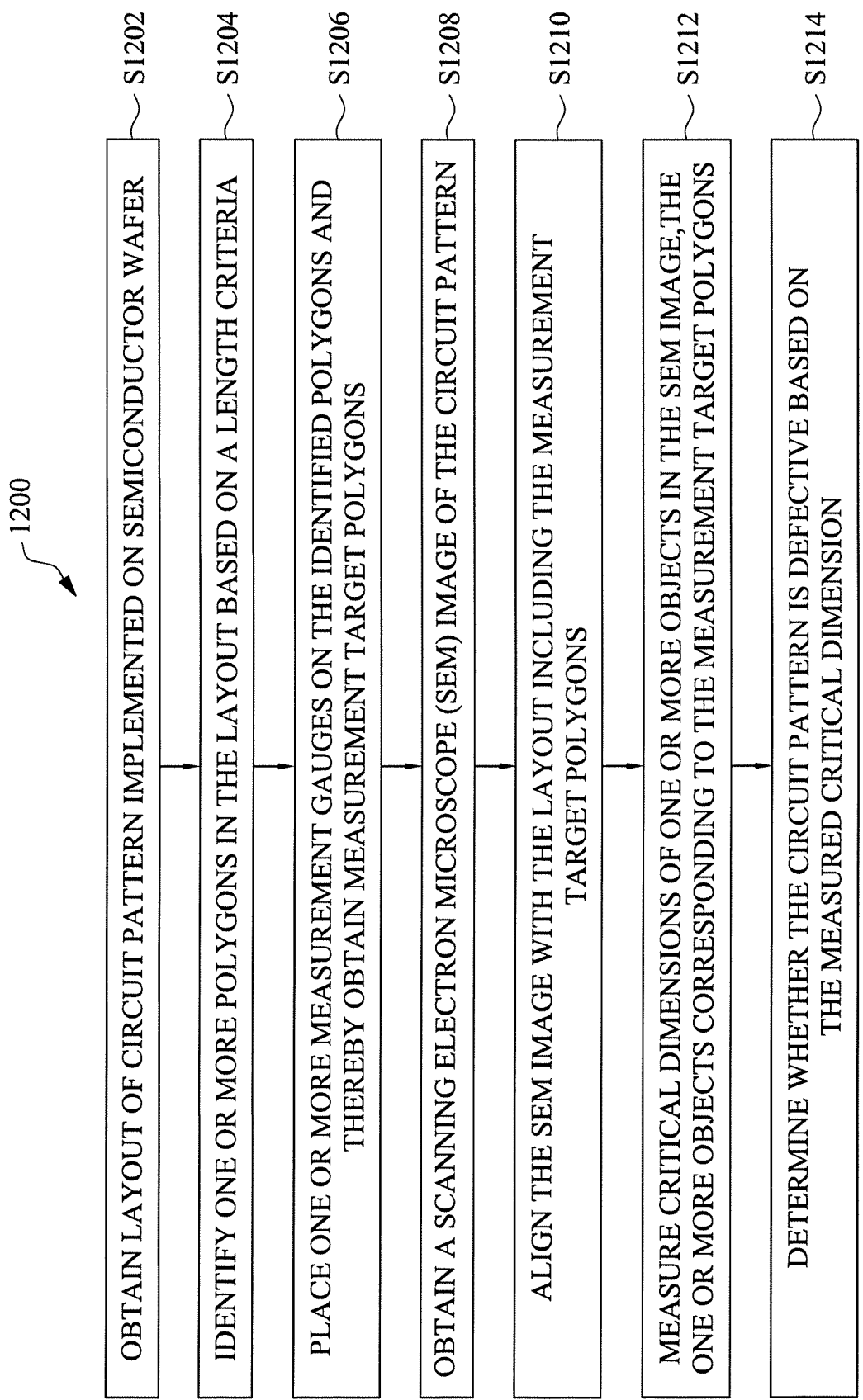
FIG. 12 is a flowchart illustrating a method of image qualification according to an embodiment of the present disclosure.

FIG. 12 is a flowchart illustrating a method 1200 of image qualification according to an embodiment of the present disclosure. It is understood that additional operations can be provided before, during, and after processes discussed in FIG. 12, and some of the operations described below can be replaced or eliminated, for additional embodiments of the method. The order of the operations/processes may be interchangeable and at least some of the operations/processes may be performed in a different sequence. At least two or more operations/processes may be performed overlapping in time, or almost simultaneously.

The method 1200 includes an operation S1202 of obtaining a layout of a circuit pattern implemented on a semiconductor wafer. In operation S1204, one or more polygons in the layout are identified based on a length criteria. In operation S1206, one or more measurement gauges are placed on the identified polygons and thereby measurement target polygons are obtained. In operation S1208, a scanning electron microscope (SEM) image of the circuit pattern is obtained. In some embodiments, the image is obtained using a critical dimension SEM (CD-SEM). In operation S1210, the SEM image is aligned with the layout including the measurement target polygons. In operation S1212, a critical dimension of one or more objects in the SEM image is measured. The one or more objects correspond to the measurement target polygons. In operation S1214, it is determined whether the circuit pattern is acceptable based on the measured critical dimension.

An embodiment of the disclosure is a method of image qualification, including obtaining a layout of a circuit pattern implemented on a semiconductor wafer. One or more polygons are identified in the layout based on a length criteria. One or more measurement gauges are placed on the identified polygons and thereby measurement target polygons are obtained. A scanning electron microscope (SEM) image of the circuit pattern is obtained. The SEM image is aligned with the layout including the measurement target polygons. A critical dimension of one or more objects in the SEM image is measured. The one or more objects correspond to the measurement target polygons. It is determined whether the circuit pattern is acceptable based on the measured critical dimension. In an embodiment, identifying the one or more polygons in the layout based on the length criteria includes identifying a first polygon having a length greater than a first threshold dimension, and identifying a plurality of segments of the first polygon, each segment having a length equal to a second threshold dimension. In an embodiment, one or more measurement gauges are placed in each segment of the plurality of segments of the first polygon. In an embodiment, each segment of the plurality of segments has a same width. In an embodiment, identifying the one or more polygons in the layout based on the length criteria further includes identifying a second polygon having a length greater than a third threshold dimension and less than the first threshold dimension. In an embodiment, a single measurement gauge is placed on the second polygon. In an embodiment, the method further includes measuring critical dimensions of all segments of the plurality of segments in the first polygon, generating a normal distribution of the critical dimensions, calculating a mean value of the critical dimensions from the normal distribution, comparing the measured critical dimension of the object with the mean value to obtain a comparison; and determining whether the circuit pattern is acceptable based on the comparison. In an embodiment, the circuit pattern is identified to be unacceptable when the measured critical dimension of the object is greater than the mean value. In an embodiment, the circuit pattern is determined to be acceptable when the measured critical dimension of the object is less than the mean value.

Another embodiment of the disclosure is a system including a memory, storing instructions, and at least one processor that executes the instructions. By executing the instructions, the processor obtains a layout of a circuit pattern implemented on a semiconductor wafer. The processor identifies a first polygon having a length greater than a first threshold dimension. The processor identifies a plurality of segments of the first polygon. Each segment has a length equal to a second threshold dimension. The processor places one or more measurement gauges on the identified polygons and thereby obtains measured polygons. The processor aligns a scanning electron microscope (SEM) image of the circuit pattern with the layout including the measured polygons. The processor measures a critical dimension of one or more objects in the SEM image. The one or more objects correspond to the one or more polygons. The processor determines whether the circuit pattern is acceptable based on the measured critical dimension. In an embodiment, the at least one processor executes the instructions to place a measurement gauge in each segment of the plurality of segments of the first polygon. In an embodiment, each segment of the plurality of segments has a same width. In an embodiment, the at least one processor executes the instructions to identify a second polygon having a length greater than a third threshold dimension and less than the first threshold dimension. In an embodiment, the at least one processor executes the instructions to place a single measurement gauge on the second polygon. In an embodiment, the at least one processor executes the instructions to measure critical dimensions of all segments of the plurality of segments in the first polygon, generate a normal distribution of the critical dimensions, calculate a mean value of the critical dimensions from the normal distribution, compare the measured critical dimensions of the one or more object with the mean value to obtain a comparison, and determine whether the circuit pattern is acceptable based on the comparison. In an embodiment, the at least one processor executes the instructions to determine the circuit pattern is unacceptable when the measured critical dimension of the object is greater than the mean value. In an embodiment, the at least one processor executes the instructions to determine the circuit pattern is acceptable when the measured critical dimension of the object is less than the mean value.

Another embodiment of the disclosure is a non-transitory, computer-readable medium comprising instructions stored in a memory which, when executed by a processor cause a computer to perform a method. The method comprises obtaining a layout of a circuit pattern implemented on a semiconductor wafer. A first polygon having a length greater than a first threshold dimension is identified. A plurality of segments of the first polygon are identified. Each segment has a length equal to a second threshold dimension. One or more measurement gauges are placed on the identified polygons and thereby measured polygons are obtained. A scanning electron microscope (SEM) image of the circuit pattern is obtained. The SEM image with the layout including the measured polygons is obtained. A critical dimension of one or more objects in the SEM image is measured. In an embodiment, the one or more objects correspond to the one or more polygons. Critical dimensions of all segments of the plurality of segments in the first polygon are measured. A normal distribution of the critical dimensions is generated. A mean value of the critical dimensions is calculated from the normal distribution. The measured critical dimensions of the one or more object is compared with the mean value to obtain a comparison. It is determined whether the circuit pattern is acceptable based on the comparison. In an embodiment, a second polygon is identified having a length greater than a third value and less than the first threshold dimension. In an embodiment, placing one or more measurement gauges includes placing a measurement gauge in each segment of the plurality of segments of the first polygon, and placing a single measurement gauge on the second polygon.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    obtaining a layout of a circuit pattern implemented on a semiconductor wafer;
    identifying one or more polygons in the layout based on a length criteria;
    placing one or more measurement gauges on the one or more polygons identified in the layout;
    obtaining a scanning electron microscope (SEM) image of the circuit pattern;
    aligning the SEM image with the layout including the one or more polygons identified in the layout;
    measuring a critical dimension of one or more objects in the SEM image, the one or more objects corresponding to the one or more polygons identified in the layout; and
    determining whether the circuit pattern is acceptable based on the measured critical dimension, wherein identifying the one or more polygons in the layout based on the length criteria includes
    identifying a first polygon having a length greater than a first threshold dimension, and
    identifying a plurality of segments of the first polygon, each segment having a length equal to a second threshold dimension.

2. The method of claim 1, wherein placing the one or more measurement gauges includes placing the measurement gauge in each segment of the plurality of segments of the first polygon.

3. The method of claim 1, wherein each segment of the plurality of segments has a same width.

4. The method of claim 1, wherein identifying the one or more polygons in the layout based on the length criteria further includes identifying a second polygon having a length greater than a third threshold dimension and less than the first threshold dimension.

5. The method of claim 4, wherein placing the one or more measurement gauges includes placing a single measurement gauge on the second polygon.

6. The method of claim 1, further comprising:
    measuring critical dimensions of all segments of the plurality of segments in the first polygon;
    generating a normal distribution of the critical dimensions;
    calculating a mean value of the critical dimensions from the normal distribution;
    comparing the measured critical dimension of the object with the mean value to obtain a comparison; and
    determining whether the circuit pattern is acceptable based on the comparison.

7. The method of claim 6, further comprising determining the circuit pattern is unacceptable when the measured critical dimension of the object is greater than the mean value.

8. The method of claim 6, further comprising determining the circuit pattern is acceptable when the measured critical dimension of the object is less than the mean value.

9. A system, comprising:
    a memory, storing instructions; and
    at least one processor that executes the instructions to:
        obtain a layout of a circuit pattern implemented on a semiconductor wafer;
        identify a first polygon having a length greater than a first threshold dimension;
        identify a plurality of segments of the first polygon, each segment having a length equal to a second threshold dimension;
        place one or more measurement gauges on the first polygon;
        align a scanning electron microscope (SEM) image of the circuit pattern with the layout including the first polygon including the one or more measurement gauges;
        measure a critical dimension of one or more objects in the SEM image, the one or more objects corresponding to the first polygon including the one or more measurement gauges; and
        determine whether the circuit pattern is acceptable based on the measured critical dimension.

10. The system of claim 9, wherein the at least one processor executes the instructions to place a measurement gauge in each segment of the plurality of segments of the first polygon.

11. The system of claim 10, wherein each segment of the plurality of segments has a same width.

12. The system of claim 10, wherein the at least one processor executes the instructions to identify a second polygon having a length greater than a third threshold dimension and less than the first threshold dimension.

13. The system of claim 12, wherein the at least one processor executes the instructions to place a single measurement gauge on the second polygon.

14. The system of claim 10, wherein the at least one processor executes the instructions to:
   measure critical dimensions of all segments of the plurality of segments in the first polygon;
   generate a normal distribution of the critical dimensions;
   calculate a mean value of the critical dimensions from the normal distribution;
   compare the measured critical dimensions of the one or more object with the mean value to obtain a comparison; and
   determine whether the circuit pattern is acceptable based on the comparison.

15. The system of claim 14, wherein the at least one processor executes the instructions to determine the circuit pattern is unacceptable when the measured critical dimension of the object is greater than the mean value.

16. The system of claim 14, wherein the at least one processor executes the instructions to determine the circuit pattern is acceptable when the measured critical dimension of the object is less than the mean value.

17. A non-transitory, computer-readable medium comprising instructions stored in a memory which, when executed by a processor cause a computer to perform a method, the method comprising:
   obtaining a layout of a circuit pattern implemented on a semiconductor wafer;
   identifying a first polygon having a length greater than a first threshold dimension;
   identifying a plurality of segments of the first polygon, each segment having a length equal to a second threshold dimension;
   placing one or more measurement gauges on the first polygon;
   obtaining a scanning electron microscope (SEM) image of the circuit pattern;
   aligning the SEM image with the layout including the first polygon including the one or more measurement gauges;
   measuring a critical dimension of one or more objects in the SEM image, the one or more objects corresponding to the first polygon including the one or more measurement gauges;
   measuring critical dimensions of all segments of the plurality of segments in the first polygon;
   generating a normal distribution of the critical dimensions;
   calculating a mean value of the critical dimensions from the normal distribution;
   comparing the measured critical dimensions of the one or more object with the mean value to obtain a comparison; and
   determining whether the circuit pattern is acceptable based on the comparison.

18. The non-transitory, computer-readable medium of claim 17, further comprising:
   identifying a second polygon having a length greater than a third value and less than the first threshold dimension.

19. The non-transitory, computer-readable medium of claim 18, wherein placing the one or more measurement gauges includes:
   placing the one or more measurement gauge in each segment of the plurality of segments of the first polygon; and
   placing a single measurement gauge on the second polygon.

* * * * *